(12) United States Patent
Trulls Fortuny et al.

(10) Patent No.: US 8,564,371 B2
(45) Date of Patent: Oct. 22, 2013

(54) AMPLIFICATION CIRCUIT

(75) Inventors: Xavier Trulls Fortuny, Barcelona (ES);
Diego Mateo Pena, Barcelona (ES);
Adria Bofill-Petit, Barcelona (ES)

(73) Assignee: Broadcom Corporation, Irvine, CA (US)

( * ) Notice: Subject to any disclaimer, the term of this patent is extended or adjusted under 35 U.S.C. 154(b) by 18 days.

(21) Appl. No.: 13/326,443

(22) Filed: Dec. 15, 2011

(65) Prior Publication Data

US 2012/0161875 A1    Jun. 28, 2012

(30) Foreign Application Priority Data

Dec. 22, 2010    (GB) ...................................... 1021775

(51) Int. Cl.
*H03G 3/10*    (2006.01)
(52) U.S. Cl.
USPC .......................................... 330/284; 330/302
(58) Field of Classification Search
USPC .................... 330/284, 302, 51, 144
See application file for complete search history.

(56) References Cited

U.S. PATENT DOCUMENTS

| | | | | |
|---|---|---|---|---|
| 5,121,075 A * | 6/1992 | Roach | ........................... | 330/126 |
| 6,621,346 B1 * | 9/2003 | Nabicht et al. | ................ | 330/284 |
| 6,771,130 B2 * | 8/2004 | Hasegawa et al. | ............ | 330/302 |
| 6,819,768 B1 * | 11/2004 | Sculley | ........................ | 381/104 |
| 7,336,130 B2 * | 2/2008 | Takahata | ...................... | 330/284 |
| 7,355,476 B2 * | 4/2008 | Kasha et al. | ................. | 330/284 |
| 7,643,018 B1 * | 1/2010 | Brown et al. | ................ | 345/204 |
| 8,018,285 B2 * | 9/2011 | Kim et al. | .................... | 330/284 |

* cited by examiner

*Primary Examiner* — Henry Choe
(74) *Attorney, Agent, or Firm* — Garlick & Markison; Bruce E. Garlick

(57) ABSTRACT

An amplification circuit, which may be in a receive path of a communication device, includes an amplifier including at least a first amplification device and a switchable attenuation circuit. The switchable attenuation circuit includes one or more switches and a plurality of attenuation devices and is operable to provide different levels of attenuation to an input signal prior to input to the amplifier depending on the status of the one or more switches. The attenuation devices may be capacitors, wherein the capacitors may be arranged to form a capacitive divider with a level of attenuation dependent on the status of the switches. The switchable attenuation circuit may be a switched capacitive attenuation ladder of n stages, n being any integer, each ladder stage including a capacitive divider. The amplification circuit may also include a switch, which when closed provides an unattenuated path for the input signal to the amplifier input.

22 Claims, 7 Drawing Sheets

AMPLIFICATION CIRCUIT

CROSS-REFERENCE TO PRIORITY APPLICATION

This application claims priority under 35 U.S.C. §119(a) to Great Britain Application Ser. No. 1021775.0 filed Dec. 22, 2010, which is incorporated herein by reference in its entirety for all purposes.

BACKGROUND OF THE PRESENT INVENTION

1. Field of the present invention

The present invention is in the field of communications; and in particular it relates to the transmission of broadband communication data over a three-line electrical mains supply.

2. Description of the Related Art

Communication systems are well known and include Local Area Networks (LANs), Wide Area Networks (WANs), cellular networks, Wireless Local Area Networks (WLANs), Wireless Wide Area Networks (WWANs), Personal Area Networks (PANs), etc. With the growing need for the exchange of digital content (e.g. MP3 audio, MPEG4 video and digital photographs) there is a widely recognized need to improve digital communication systems. Powerline communication (PLC) is a technology that encodes data in a signal and transmits the signal on existing electricity powerlines in a band of frequencies that are not used for supplying electricity. Accordingly, PLC leverages the ubiquity of existing electricity networks to provide extensive network coverage. Furthermore, since PLC enables data to be accessed from conventional power-outlets, no new wiring needs to be installed in a building (or different parts of a building). Accordingly, PLC offers the additional advantage of reduced installation costs.

In some buildings or installations, PLC communications may be the best option for servicing communications, e.g., wireless communications incapable of penetrating walls or other structure, wireless communications deemed too insecure, installing wiring for other communication types is too expensive, etc. However, in other structures, WLANs, for example may be easier to install and service. For example, many coffee shops, restaurants, hotels, and other retail establishments use WLANs to service their customers. In still other installations, cable modem, Local Area Network (LAN), and/or other communication networks may be employed to service communications.

Each communication device includes transmit path components and receive path components, both of which couple to a servicing media, antenna, or other transmission path element. In the receive path, a received signal must be amplified prior to processing to extract data. Some received signals have a very large dynamic range, which must be effectively serviced to successfully extract incoming data. An amplifying receiver with a large dynamic range has different requirements for different level of input signal strength. Large signals (up to 10V or more) put stringent linearity requirements on the input amplifier. Small input signals (1 mV or less) require a very low noise amplifier. These two requirements are very difficult to meet with a single amplifier without select ability directed by input-signal strength.

BRIEF DESCRIPTION OF THE DRAWINGS

Embodiments of the present invention will now be described, by way of example only, by reference to the accompanying drawings, in which.

DETAILED DESCRIPTION OF THE EMBODIMENTS

Figure 1:
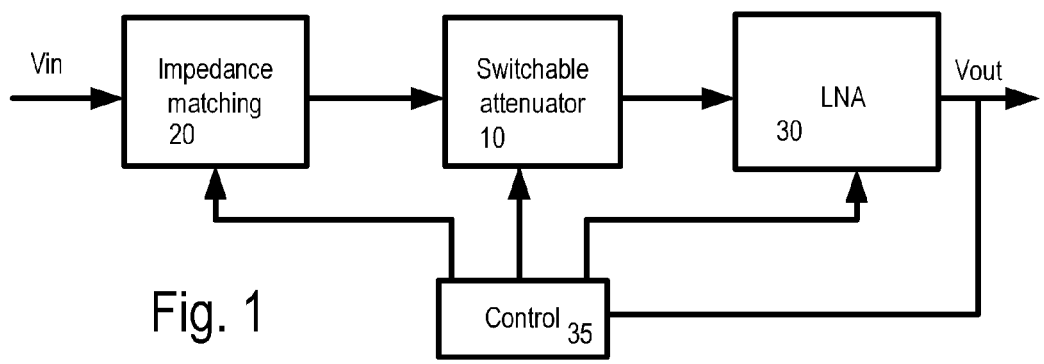
FIG. 1 illustrates schematically a low noise amplifier according to a first embodiment of the present invention.

Amplifier circuits embodying the present invention are able to accommodate a large dynamic range of input signal strengths. According to a first embodiment of the present invention, an amplification circuit includes an amplifier including at least a first amplification device and a switchable attenuation circuit. The switchable attenuation circuit includes a network of switches and attenuation devices and is operable to provide different levels of attenuation to an input signal to the amplifier depending on the status of the network of switches.

The attenuation devices may be capacitors. They may be arranged to form a capacitive divider with a level of attenuation dependent on the status of the network of switches. The switchable attenuation circuit may include a switched capacitive attenuation ladder of n stages, n being any integer, each ladder stage including a capacitive divider formed by two capacitances, and a switch for selective connection of the output of each divider to the amplifier input, the circuit being operable such that no more than one switch is closed at any time, the attenuation applied to the input signal being dependent on which of the switches is closed. The network of switches may further include a switch which when closed provides an unattenuated path for the input signal to the amplifier input.

The amplifier may include a second input, the amplification circuit having no switch in the path to the second input. The path to the second input preferably also has substantially no attenuation (substantially no attenuation in this case means no deliberate attenuation, and includes the very small unavoidable attenuation resultant from path resistance and coupling devices etc.). The second input may be provided by a second amplification device being included in the amplifier. The second amplification device may be selectively by-passable, and be arranged such that the first and second amplification devices have a cascode configuration when the second amplification device is not by-passed. "Selectively by-passable" in this context includes the ability to literally bypass the device by closing a by-pass switch, or by effectively by-passing the device in any other way such as applying a bias voltage to the device such that it effectively acts as a closed switch.

The amplification circuit may be operable such that when an input signal is above a predetermined threshold, the second amplification device is bypassed and the input signal undergoes attenuation by the switchable attenuation circuit, prior to amplification via the first input, and when an input signal is below a predetermined threshold, the second amplification device is not bypassed and the input signal is amplified via the second input without undergoing attenuation. In the latter case, the circuit may be operable such that the first input is disconnected from the amplification circuit input and the first amplification device becomes a cascode device for the second amplification device. The amplification device(s) may include a transistor.

The amplification circuit may be included in a differential arrangement, thereby providing a differential input. The amplification circuit may further include a control circuit for control of the switchable attenuation circuit and amplifier. The control circuit may include part of an automatic gain control circuit. The amplification circuit may include an impedance matching circuit at its input(s).

FIG. 1 illustrates schematically a low noise amplifier according to an embodiment of the present invention. It includes impedance matching input circuitry 20, a switchable capacitive attenuator 10, and a low noise amplifier 30 in series between input Vin and output Vout. All three of these components are under control of the control module 35, which receives the output signal Vout. Control block 35 may contain analog circuits, digital circuits or both; it may contain an ADC or may receive as input signal, the output of the ADC (not illustrated) which converts the output signal Vout into a digital code. Control block 35 may be part of the AGC (Automatic Gain Control) system (not illustrated) of the receiver.

Figure 2:
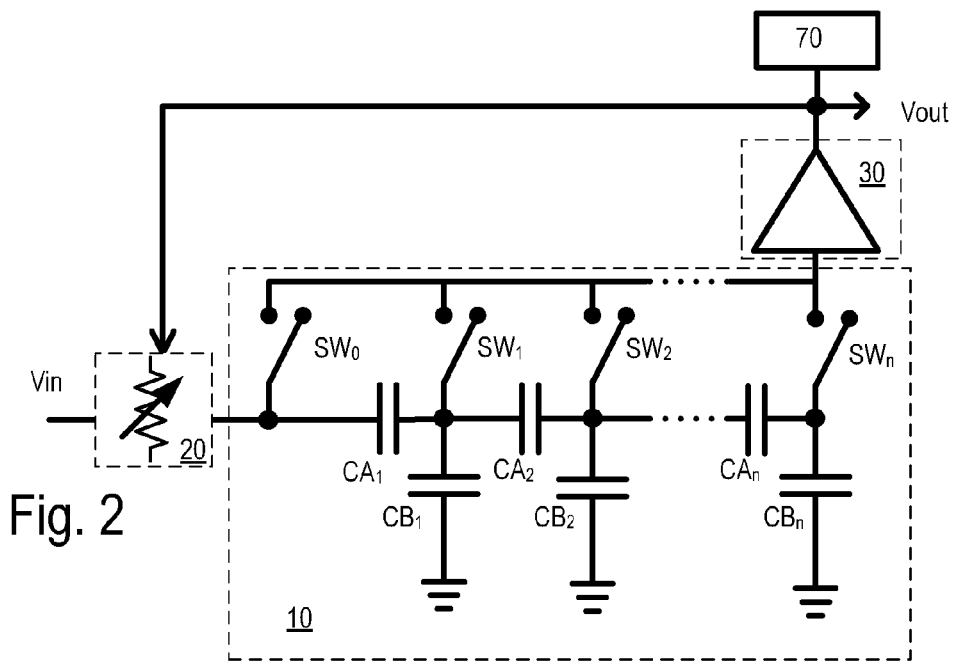
FIG. 2 illustrates the low noise amplifier of FIG. 1 with attenuator detail illustrated according to a first implementation.
Figure 3:
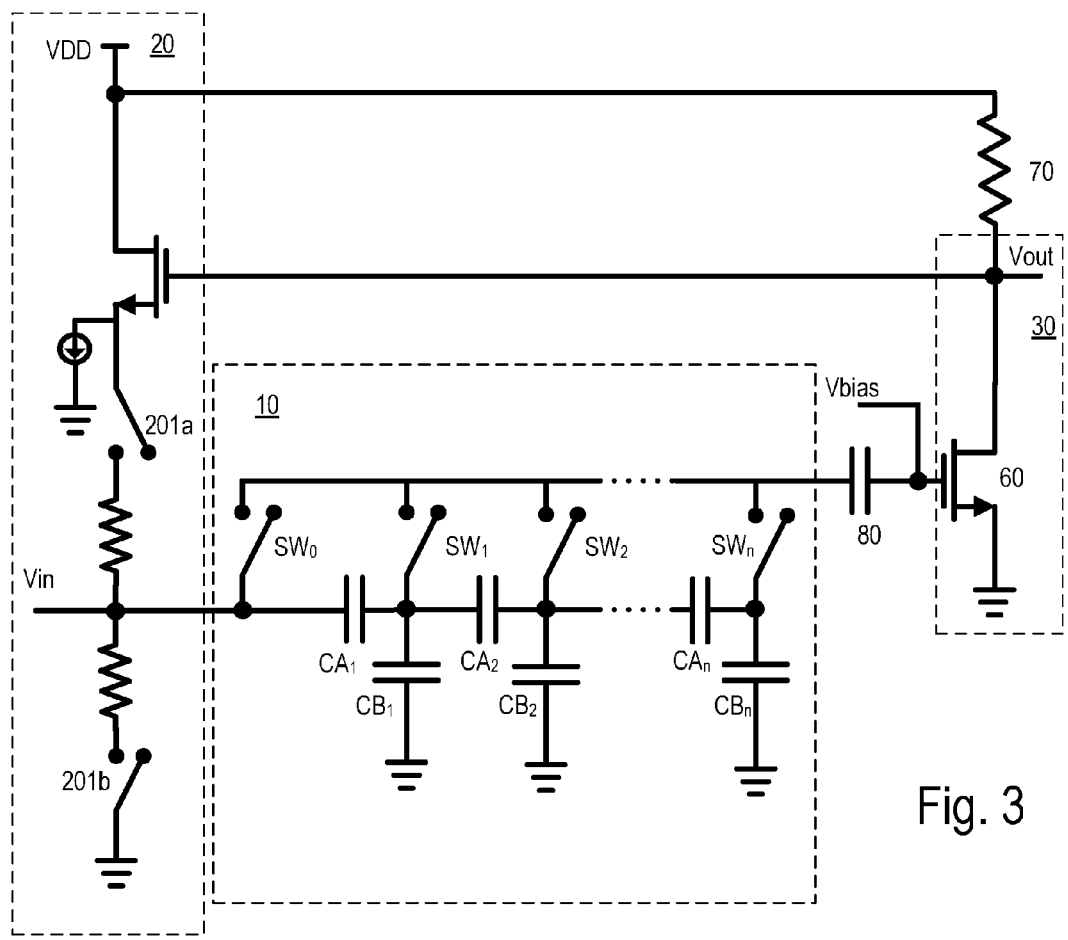
FIG. 3 illustrates the low noise amplifier of FIG. 2 at component level.

FIG. 2 illustrates the low noise amplifier of FIG. 1 with attenuator detail illustrated according to a first implementation. FIG. 3 illustrates the low noise amplifier of FIG. 2 at component level. The switchable capacitive attenuator 10 includes switches $SW_0$-$SW_n$, capacitors $CA_1$-$CA_n$ and capacitors $CB_1$-$CB_n$ arranged as illustrated. The amplifier 30 includes a transistor device 60, with its control terminal (gate) biased by signal Vbias. The circuit further includes optional load 70 at the output Vout of amplifier 30 and coupling capacitor 80 between switchable capacitive attenuator 10 and the amplifier 30 input. Optionally, the output Vout can be fed-back to the input-impedance matching block 20.

The switchable capacitive attenuator 10 includes a first switch $SW_0$ between the input Vin and the amplifier 30 input. It further includes a switched capacitive attenuation ladder $SW_1$-$SW_n$, $CA_1$-$CA_n$, $CB_1$-$CB_n$ of n stages, n being any integer. Each ladder stage includes a capacitive divider formed by capacitors CA, CB between the stage input and ground, and a switch SW at each stage output. Only one switch $SW_0$-$SW_n$ is closed at any one time, depending on the input signal strength. The first switch $SW_0$ provides a direct unattenuated path to the amplifier 30 input for very small signals. The other switches $SW_1$-$SW_n$ provide different levels of attenuation for larger signals, the attenuation being provided by the capacitor dividers.

It should be noted that the number of stages of the switchable capacitive attenuator 10 is arbitrary, and depends on the number of different attenuation levels required. A main drawback with this arrangement is that the input signal always passes through a switch, which is a considerable source of input noise on the amplifier. This input noise can be of the same order of magnitude or greater than the smallest input signals, therefore drowning them out.

Figure 4:
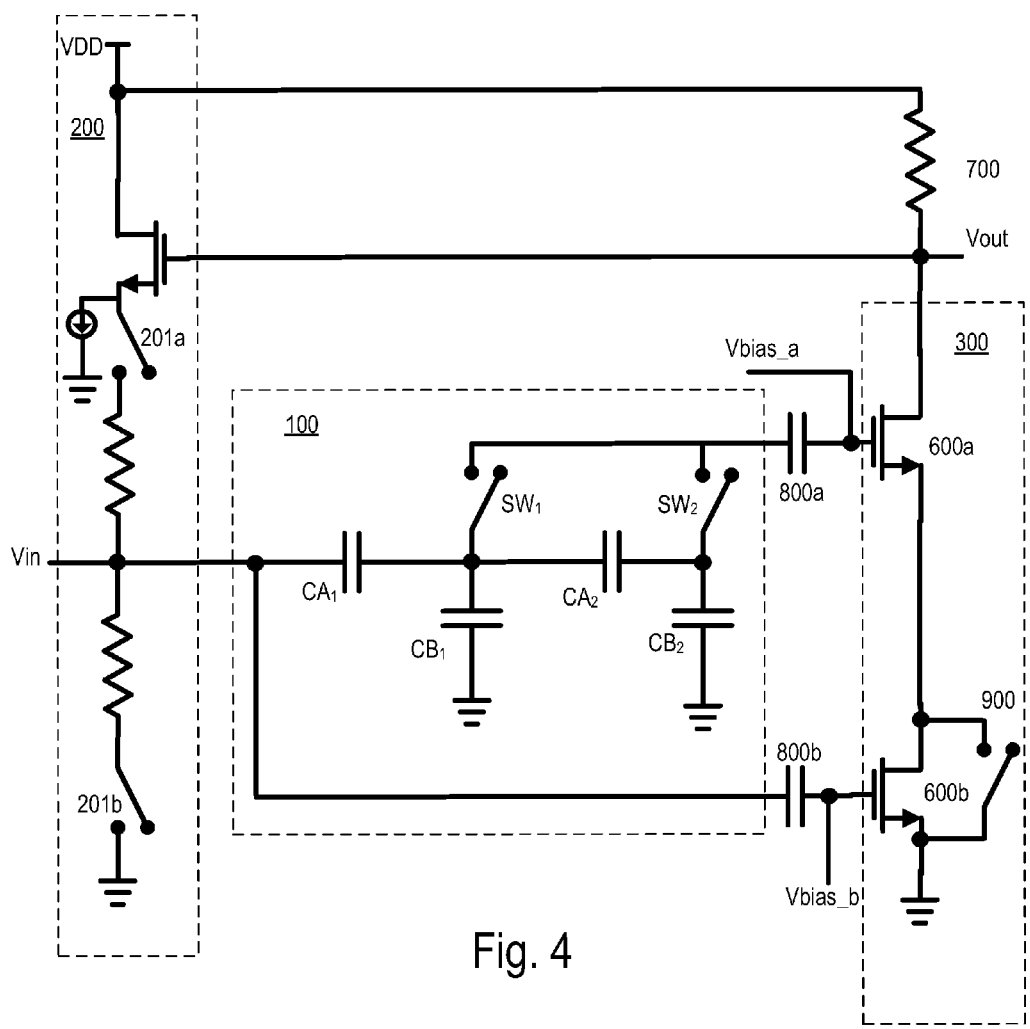
FIG. 4 illustrates the low noise amplifier of FIG. 1 according to a second implementation.

FIG. 4 illustrates the low noise amplifier of FIG. 1 according to a second implementation. Again it includes a switchable capacitive attenuator 100, impedance matching input circuitry 200, and low noise amplifier 300. The switchable capacitive attenuator 100 is similar to the previous attenuator 10, although there is no equivalent to switch $SW_0$ providing an unattenuated connection to the transistor 600a control terminal (gate). Instead, the switchable capacitive attenuator 100 includes a switched capacitive attenuation ladder $SW_1$-$SW_2$, $CA_1$-$CA_2$, $CB_1$-$CB_2$ having two stages. Of course, as with the switchable capacitive attenuator 10 depicted in FIGS. 2 and 3, the number of stages is completely arbitrary and may include more or less than the two illustrated here. The amplifier circuit 300 differs from amplifier 30 of FIGS. 2 and 3 in that it includes a second input transistor device 600b which can be bypassed with switch 900.

For medium to large input signals the circuit operates largely as the circuit of FIGS. 2 and 3. Switch 900 is closed and transistor 600b bypassed. In some other embodiments of the present invention the Vbias_b voltage at the gate of transistor 600b could be increased to effectively turn transistor 600b itself into an ON switch. Depending on the signal size and level of attenuation required, one of switch $SW_1$ (medium signals) or switch $SW_2$ (large signals) is closed and the input signal attenuated by the resulting capacitive divider and amplified by amplifier 300, which effectively consists of only transistor device 600a in this configuration.

When low level signals are on the input Vin, the amplifier operates differently. Switches $SW_1$, $SW_2$ are kept open and therefore the input is isolated from the control terminal (gate) of transistor 600a. Instead there is an uninterrupted (other than coupling capacitor 800b) switch-free path to a second input of amplifier 300, provided by the control terminal (gate) of transistor 600b. Switch 900 is opened for small signals and therefore transistor 600b is now no longer bypassed. In this configuration, amplifier 300 is effectively a cascode amplifier including transistor devices 600a (cascode transistor) and 600b (input transistor).

By providing, for small signals, a separate path to the amplifier input without a switch in series, the problem of switch noise drowning out or significantly impacting such small signals is overcome, while still providing selectable attenuation for larger input signals.

In both FIGS. 3 and 4 the optional input impedance matching can be configured differently depending on whether the input signal is weak or strong. For small input signals the output Vout is fed-back through switch 201a while switch 201b is kept open. For large signals, in order to maintain linearity, switch 201a is open and switch 201b is closed and the input termination is purely resistive.

Figure 5:
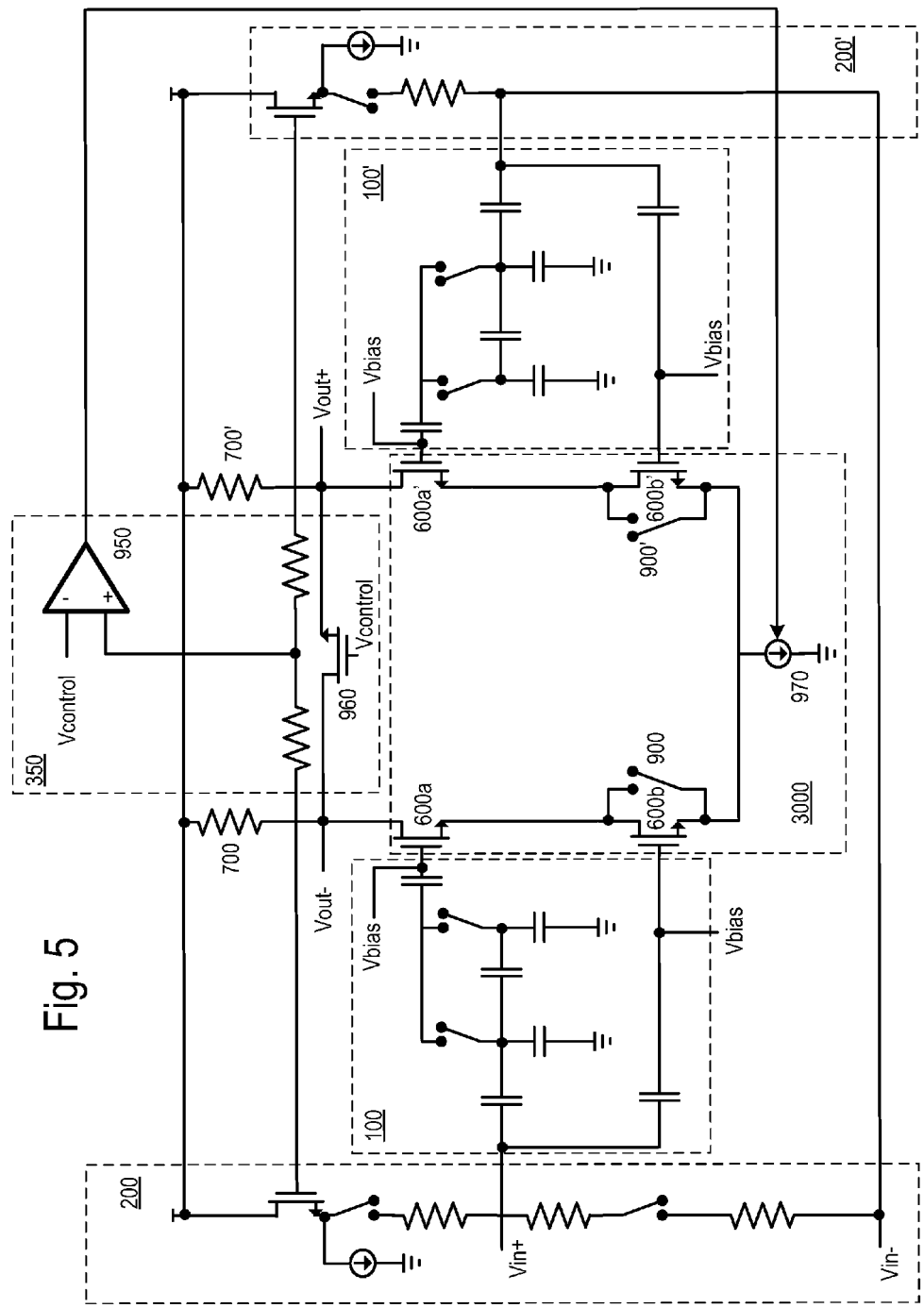
FIG. 5 illustrates a differential variation on the low noise amplifier of FIG. 4.

FIG. 5 illustrates a differential version of the amplifier of FIG. 4. Switchable capacitive attenuator 100, impedance matching input circuitry 200, load 700, transistors 600a, 600b and switch 900 are essentially the same as in the circuit of FIG. 4, but also have minor equivalents, each of which has the same reference numeral, but denoted with a prime ('). The amplifier 3000 is arranged as a differential amplifier further including current source 970 to form a long tailed pair. The amplifier 3000 further includes control circuitry 350 for the differential amplifier 3000 in the form of an amplifier 950 and transistor device 960 arranged as illustrated and requiring a control input Vcontrol. Amplifier 950 is part of the common-feedback (CMFB) loop required by the differential amplifier. Vcontrol is used to adjust the gain of the amplifier. The circuit provides for a differential input denoted as Vin+ and Vin− and differential output Vout+ and Vout−.

Figure 6:
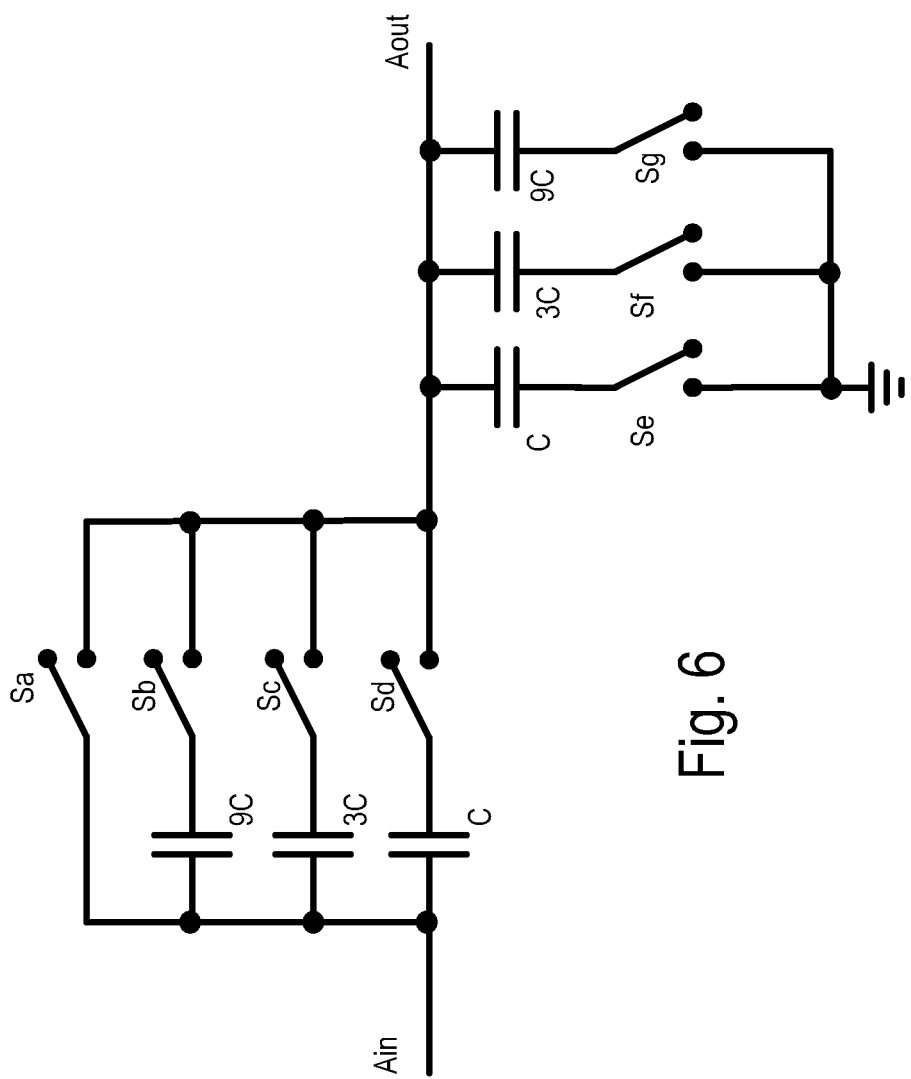
FIG. 6 illustrates a further embodiment of the variable attenuation circuit for any of the circuits of FIGS. 1-5.

FIG. 6 illustrates an alternative arrangement for the switchable capacitive attenuator 10, 100, 100' of any of the examples above. Illustrated are a first bank of capacitors C, 3C, 9C in parallel between input Ain and output Aout of the attenuator 10, 100, 100' and a second bank of capacitors C, 3C, and 9C in parallel between output Aout of the attenuator 10, 100, 100' and ground or another reference node. Each capacitor C, 3C, 9C has a switch Sb-Sg in series with it. There is a further switch Sa for the attenuator 10 of the embodiment of FIG. 2 or 3, to provide a direct path between input and output. This is not required for the attenuators 100, 100' of the other embodiments.

The capacitor labels indicate their relative capacitance, such as those labeled 3C are three times larger than those labeled C, and those labeled 9C are three times larger again. In use, one of switches Sa-Sd and one of switches Se-Sg is always closed, to form a capacitive divider. The level of attenuation depends on which switches are closed. The specific example given provides for output (ignoring switch Sa) attenuations between 1/14 (switches Sd, Se, Sf, and Sg closed) and 13/14 (switches Sd, Se, Sf and Sg closed) of the input. Various other convenient attenuations include 1/4 and 1/2. Clearly these are only example values and other relative values may be chosen for the capacitance and the number of capacitors may be varied (and each bank does not need to include the same number of capacitors), so as to tailor the attenuator 10, 100, 100' to the gain ranges of a given application.

Figure 7:
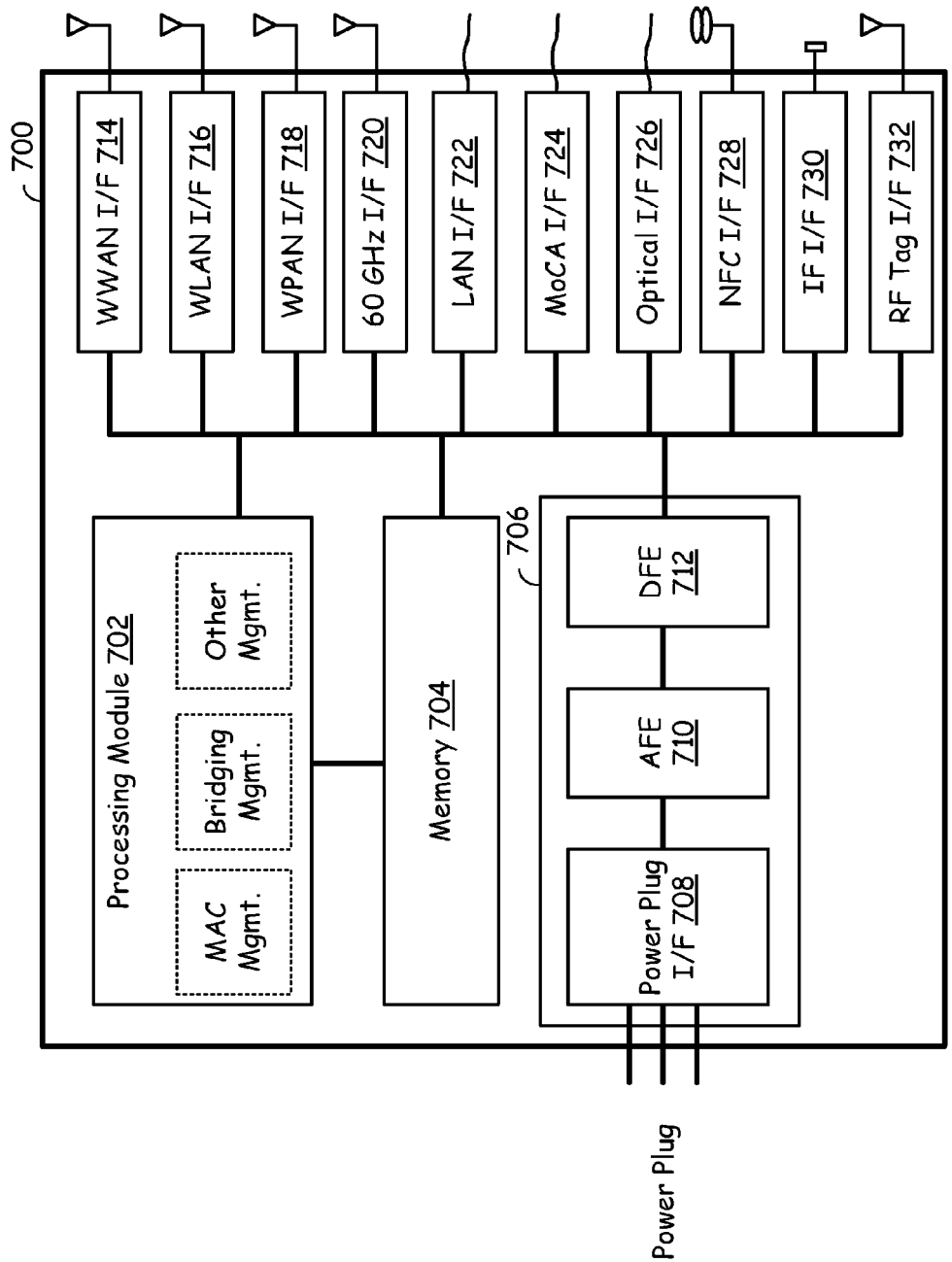
FIG. 7 is a block diagram illustrating a communication device constructed according to one or more embodiments of the present invention.

FIG. 7 is a block diagram illustrating a communication device constructed according to one or more other embodiments of the present invention. The communication device 700 supports PLC operations according to one or more PLC communication standards as well as other communication types. In some embodiments, the communication device 700 may be permanently installed within a home or other premises. The communication device 700 includes a PLC interface 706 that includes a power plug interface 708, an Analog Front End (AFE) 710, and a Digital Front End (DFE) 712. A receive path of the AFE 710 includes one or more amplifiers constructed and operating according to one or more embodiments of the present invention. Generally the AFE 710 includes analog signal processing elements while the DFE 712 includes digital signal processing elements. At least one Analog to Digital Converter (ADC) and at least one Digital to Analog Converter (DAC) service analog to digital and digital to analog signal conversion operations, respectively. The AFE 710 includes one or more low noise amplifiers previously described herein.

The communication device 700 also includes one or more other communication interfaces, including a Wireless Wide Area Network (WWAN) interface 714, e.g., a WiMAX interface, a Wireless Local Area Network (WLAN) interface 716, e.g., an 802.11x interface, a Wireless Personal Area Network (WPAN) interface 718, e.g., a Bluetooth interface, a 60 GHz interface 720 (millimeter wave interface), a Local Area Network (LAN) interface 722, e.g., an Ethernet interface, a cable interface, e.g. Multimedia over Coax Alliance (MoCA) interface 724, an optical interface 726, a Near Field Communication (NFC) I/F 728, an Infra-Red I/F 730, and/or an RF Tag I/F 732. Each of these other communication interfaces includes a receive path, which may include one or more amplifiers constructed according to one or more embodiments of the present invention. Further, a portion of all of one or more of these interfaces may service multiple communication types, e.g., cable modem communications and RF communications, PLC communications and LAN communications, etc.

The user should appreciate that the communication device 700 may bridge communications between a power plug and one or more devices, e.g., between the power plug and a desktop computer, a laptop computer, a touchpad computer, an appliance, a television, another entertainment system device, etc., via the PLC interface 706 and one or more of the other communication interfaces 714, 716, 718, 720, 722, 724, 726, 728, 730, and/or 732. Bridging may also occur between any two or more of interfaces 706, 714, 716, 718, 720, 722, 724, 726, 728, 730, and/or 732

The processing module 702 may include one or more of a system processor, a digital signal processor, a processing module, dedicated hardware, an application specific integrated circuit (ASIC), or other circuitry that is capable of executing software instructions and for processing data. In particular, the processing module 702 is operable to support Medium Access Control (MAC) management, communications bridging management, and other management of the communications circuitry of the communication device 700. The memory 704 may be RAM, ROM, FLASH RAM, FLASH ROM, optical memory, magnetic memory, or other types of memory that is capable of storing data and/or instructions and allowing processing circuitry to access same. The processing module 702 and the memory 704 supports operations of embodiments of the present invention as further described herein.

Figure 8:
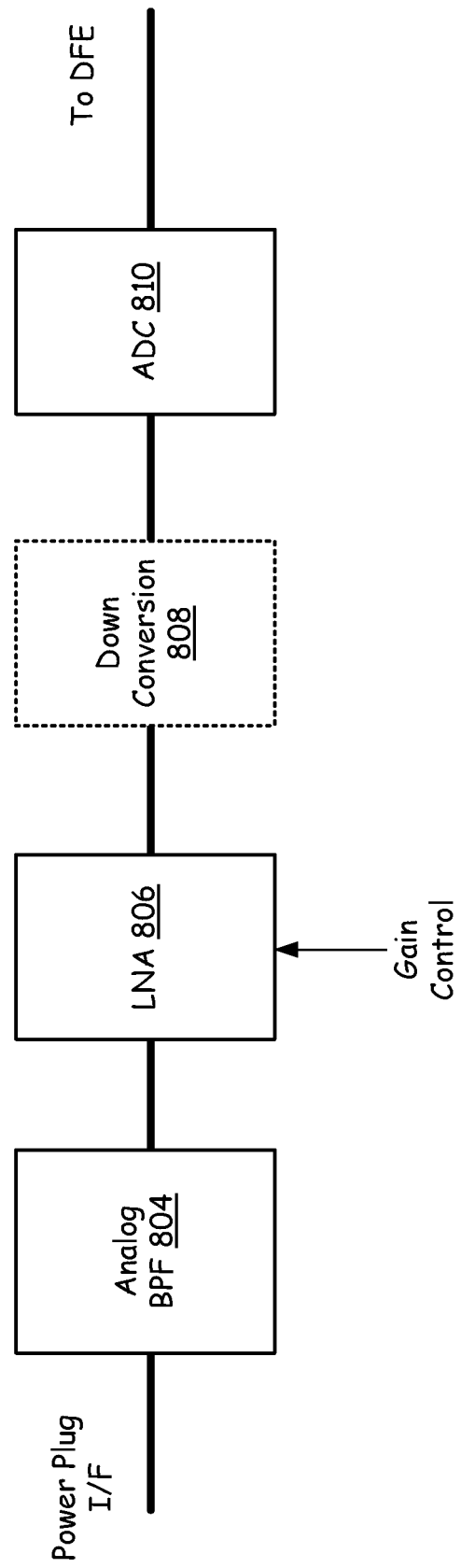
FIG. 8 is a block diagram illustrating components of a receive path of a communication device that includes a low noise amplifier constructed and operating according to one or more embodiments of the present invention.

FIG. 8 is a block diagram illustrating components of a receive path of a communication device that includes a low noise amplifier constructed and operating according to one or more embodiments of the present invention. The receive path may be included in one or more of the PLC I/F 706 and/or one or more I/Fs 714-732 of the communication device 700. The receive path includes one or more analog filters 804, a low noise amplifier 806 constructed according to the present invention, an optional down conversion module 808, and an Analog to Digital Converter (ADC) 810.

Circuitry described herein that performs particular functions described herein may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions, which may be considered singularly or in combination a "processing module." The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributed located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry including the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the FIGs. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the present invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the present invention.

The invention claimed is:

1. An amplification circuit comprising;
an amplifier including at least a first amplification device; and
a switchable attenuation circuit;
wherein the switchable attenuation circuit comprises one or more switches and a plurality of attenuation devices and is operable to provide different levels of attenuation to an input signal prior to input to the amplifier depending on the status of the one or more switches, wherein the switchable attenuation circuit further comprises a switch which when closed provides an unattenuated path for the input signal to the amplifier input.

2. The amplification circuit of claim 1, wherein the attenuation devices are capacitors.

3. The amplification circuit of claim 2 wherein the capacitors are arranged to form a capacitive divider with a level of attenuation dependent on the status of the switches.

4. The amplification circuit of claim 1, wherein the switchable attenuation circuit comprises a switched capacitive attenuation ladder of n stages, n being any integer, each ladder stage including a capacitive divider formed by two capacitors, and a switch for selective connection of the output of each divider to the amplifier input, the circuit being operable such that no more than one switch is closed at any time, the attenuation applied to the input signal being dependent on which of the switches is closed.

5. The amplification circuit of claim 1, wherein the switchable attenuation circuit comprises a plurality of capacitors in parallel between an input of the switchable attenuation circuit and the input of the amplifier and a plurality of capacitors in parallel between an input of the amplifier and ground or other reference node, each capacitor having a switch in series with it, the attenuation applied to the input signal being dependent on the combination of switches closed.

6. The amplification circuit of claim 1, wherein the amplifier comprises a second input, the amplification circuit provides substantially no attenuation for the second input.

7. The amplification circuit of claim 6, wherein the second input comprises a second amplification device in the amplifier, the amplification circuit being operable such that the second amplification device is made selectively by-passable.

8. The amplification circuit of claim 7, wherein:
when an input signal is above a predetermined threshold, the second amplification device is bypassed and the input signal undergoes attenuation by the switchable attenuation circuit, prior to amplification via the first input; and when an input signal is below a predetermined threshold, the second amplification device is not bypassed and the input signal is amplified via the second input without prior attenuation.

9. The amplification circuit of claim 8, wherein the first input is disconnected from the amplification circuit input, the first amplification device becomes a cascode device for the second amplification device.

10. The amplification circuit of claim 1, wherein the amplification circuit operates differentially.

11. The amplification circuit of claim 1, further comprising a control circuit for control of the switchable attenuation circuit and amplifier.

12. The amplification circuit of claim 11, wherein the control circuit comprises part of an automatic gain control circuit.

13. The amplification circuit of claim 1, further comprising an impedance matching circuit at its input(s).

14. A communication device comprising:
processing circuitry;
memory coupled to the processing circuitry; and
a communication interface coupled to the processing circuitry having a receive path having an amplifier comprising:
at least a first amplification device;
a switchable attenuation circuit;
wherein the switchable attenuation circuit comprises one or more switches and a plurality of attenuation devices and is operable to provide different levels of attenuation to an input signal prior to a first input to the amplifier depending on the status of the one or more switches; and
wherein the amplifier comprises a second input, the amplifier providing substantially no attenuation for the second input.

15. The communication device of claim 14, wherein the communication interface comprises one or more of:
Power Line Communication (PLC) interface:
a Local Area Network (LAN) interface;
a Wireless Wide Area Network (WWAN) interface;
a Wireless Local Area Network (WLAN) interface;
a coaxial interface;
a millimeter wave interface;
a cellular telephony interface;
a Near Field Communication (NFC) standard;
an infrared interface; and
an optical interface.

16. The communication device of claim 14, wherein the switchable attenuation circuit comprises a switched capacitive attenuation ladder of n stages, n being any integer, each ladder stage including a capacitive divider formed by two capacitors, and a switch for selective connection of the output of each divider to the amplifier input, the circuit being operable such that no more than one switch is closed at any time, the attenuation applied to the input signal being dependent on which of the switches is closed.

17. The communication device of claim 14, wherein the switchable attenuation circuit comprises a plurality of capacitors in parallel between an input of the switchable attenuation circuit and the input of the amplifier and a plurality of capacitors in parallel between an input of the amplifier and ground or other reference node, each capacitor having a switch in series with it, the attenuation applied to the input signal being dependent on the combination of switches closed.

18. The communication device of claim 14, wherein the switchable attenuation circuit further comprises a switch which when closed provides an unattenuated path for the input signal to the amplifier input.

19. The communication device of claim 14, wherein the second input comprises a second amplification device in the amplifier such that the second amplification device is made selectively by-passable.

20. The communication device of claim 19, wherein:
when an input signal is above a predetermined threshold, the second amplification device is bypassed and the input signal undergoes attenuation by the switchable attenuation circuit, prior to amplification via the first input; and when an input signal is below a predetermined threshold, the second amplification device is not bypassed and the input signal is amplified via the second input without prior attenuation.

21. An amplification circuit comprising;
an amplifier including at least a first amplification device; and
a switchable attenuation circuit configured to provide different levels of attenuation to an input signal prior to input to the amplifier and comprising a plurality of capacitors in parallel between an input of the switchable attenuation circuit and the input of the amplifier and a plurality of capacitors in parallel between an input of the amplifier and ground or other reference node, each capacitor having a switch in series with it, the attenuation applied to the input signal being dependent on the combination of switches closed.

22. The amplification circuit of claim 21, further comprising a control circuit for control of the switchable attenuation circuit and amplifier.

* * * * *